(12) United States Patent
Toyoda et al.

(10) Patent No.: US 6,884,651 B2
(45) Date of Patent: Apr. 26, 2005

(54) PRODUCING METHOD OF CMOS IMAGE SENSOR

(75) Inventors: Takashi Toyoda, Tokyo (JP); Masatoshi Kimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/615,929

(22) Filed: Jul. 10, 2003

(65) Prior Publication Data
US 2004/0147068 A1 Jul. 29, 2004

(30) Foreign Application Priority Data
Jan. 24, 2003 (JP) ........................................ 2003-016231

(51) Int. Cl.⁷ ............................................. H01L 21/00
(52) U.S. Cl. ........................ 438/72; 438/48; 438/197; 438/309; 438/636; 257/292
(58) Field of Search ......................... 438/72, 48, 197, 438/309, 636; 257/69, 186, 199, 204, 233, 288, 292, 437, 462

(56) References Cited

U.S. PATENT DOCUMENTS 6,060,765 A 5/2000 Maeda
6,071,826 A * 6/2000 Cho et al. ................... 438/723
6,287,886 B1 * 9/2001 Pan ............................. 438/57
6,303,406 B1 * 10/2001 Chen et al. .................. 438/72
6,380,568 B1 * 4/2002 Lee et al. .................... 257/251
6,635,912 B2 * 10/2003 Ohkubo ...................... 257/292
2002/0027239 A1 3/2002 Ohkubo

FOREIGN PATENT DOCUMENTS

JP 2002-83949 A 3/2002

* cited by examiner

*Primary Examiner*—David Nelms
*Assistant Examiner*—Long Tran
(74) *Attorney, Agent, or Firm*—Burns, Doane, Swecker & Mathis, L.L.P.

(57) ABSTRACT

A CMOS image sensor is made such that an oxide film, a nitride film, an oxide film, and a nitride film constituting an antireflection film are stacked over the surface of a photodiode, and the oxide film and the nitride film are anisotropically etched, to thereby form sidewalls at both sides of a gate electrode constituting an N type MOS transistor.

4 Claims, 8 Drawing Sheets

PRODUCING METHOD OF CMOS IMAGE SENSOR

BACKGROUND OF THE INVENTION

1. Field of the Invention

The present invention relates to a producing method of a CMOS image sensor.

2. Description of the Related Art

Conventionally, in a CMOS image sensor, the surface e layer of its photodiode converting light into an electric signal has been formed of only an oxide film. The incident light passes through the oxide film having a refractive index of approximately 1.46 from air having a refractive index of approximately 1, and impinges on the photodiode formed from silicon having a refractive index of about 3–5. When light thus impinges on a substance having a higher refractive index from a substance having a lower refractive index, the incidence efficiency of the incident light on the photodiode reduces because of the reflection caused at the interface therebetween. The greater the difference between their refractive indices, the more reflection is caused at the interface. For this reason, Non-patent Literature 1 describes the device in which a layer having an intermediate refractive index between the ones of the oxide film and the silicon forming the photodiode is formed therebetween, and the incidence efficiency of the incident light on the photodiode is thereby improved by reducing the reflection (Refer to Non-patent Literature 1).

The multilayer antireflection film described in the Non-patent Literature 1 is formed in a three-layered structure of an oxide film, a nitride film, and an oxide film. The transmittance of the incident light on the photodiode is improved by forming a nitride film over the photodiode through the medium of a thin oxide film in the literature. However, such an arrangement needs the process of forming the nitride film over the photodiode as an antireflection film, and moreover such an antireflection film has a limitation in control of the dependence of the transmission characteristic on the wavelength. That is, such an antireflection film only improves the light transmittance in the visible region, but the film cannot reduce the transmittance of near infrared rays deteriorating the color reproduction of the color image sensor.

On the other hand, Patent Literature 1 discloses the following technique serving as a producing method of a conventional CMOS image sensor. A mask pattern exposing only the portion that becomes a low-concentration diffused region within the P type well, is formed by photolithography. The exposed area is doped with low-concentration N type impurities by means of ion implantation of phosphorus or the like, to thereby form a low-concentration diffused region therein. A mask pattern covered with a photodiode and silicon oxide film is formed on the P type well by photolithography, and both of the side areas of the gate electrode are doped with N type impurities by means of ion implantation, to thereby form a high-concentration diffused source region and a high-concentration diffused drain region in the P type well. At that time, because the gate electrode and its sidewalls serve as a mask, low-concentration diffused regions remain directly underneath the zone, and thereby a MOSFET having a so-called LDD structure is formed.

Further, a multilayer antireflection film is formed by alternately depositing an insulating film formed of oxide film and an insulating film formed of nitride film over the region including the surfaces of the photodiode and the MOSFET. A predetermined mask pattern is formed over the multilayer antireflection film by photolithography. The multilayer antireflection film is left only over the surface of the P type diffused layer that becomes the photodetecting surface of the photodiode and its adjacent region, and the antireflection film locating over the other regions is removed by etching.

Subsequently, a first interlayer insulation film is formed over the region including the surfaces of the multilayer antireflection film, the diffused layers, and the gate electrode, then contact holes electrically connecting the diffused layers and wiring described later are formed within the interlayer insulation film by the predetermined etching process, and after that contact plugs are inserted in the contact holes. In addition, a second interlayer insulation film is deposited over the first interlayer insulation film such that the second interlayer insulation film is connected with these contact plugs, and then a light-blocking film is formed by sputtering procedure or the like over the surface of the second interlayer insulation film other than the portion that becomes the photodetecting surface of the photodiode, to thereby produce a CMOS image sensor. The conventional CMOS image sensor has been produced in this manner.

Non-Patent Literature 1:

"High-Sensitivity and No-Crosstalk Pixel Technology for Embedded CMOS Image Sensor," IEEE TRANSACTIONS ON ELECTRON DEVICES, VOL. 48, NO. 10, October 2001, pp. 2221–2227.

Patent Literature 1:

Japanese Kokai Patent Publication No. 2002-083949/ 2002, pp. 3–5, FIGS. 1–9.

Because the conventional producing method of the CMOS image sensor is carried out as mentioned above, there have been the problem that the process of separately forming the nitride film serving as the antireflection film over the photodiode is needed, and moreover the antireflection film has a limitation in control of the dependence of the transmission characteristic on the wavelength. That is, there has been the problem that the conventional producing method of the CMOS image sensor needs a large number of processes. Furthermore there has been the problem that the antireflection film produced by the conventional producing method of the CMOS image sensor only improves the light transmittance in the visible region, but the film cannot reduce the transmittance of near-infrared rays deteriorating the color reproduction of the color image sensor.

SUMMARY OF THE INVENTION

The present invention has been accomplished to solve the above-mentioned problem. An object of the present invention is to provide a producing method of a CMOS image sensor, capable of forming an antireflection film that enhances the transmittance of the incident light and reduces the transmission of near-infrared rays, over the photodiode without need for a special step.

According to a producing method of a CMOS image sensor in accordance with the present invention, the step of forming the antireflection film includes the steps of: forming a first insulating film over the surface of the photodiode and the surface of a gate electrode constituting the MOS transistor; forming a second insulating film over the surface of the first insulating film such that the second insulating film is thicker than the first insulating film; and forming sidewalls at the sides of the gate electrode by anisotropically etching the first insulating film and the second insulating film.

As mentioned above, according to the present invention, because it is arranged that a first insulating film be formed over the surfaces of the photodiode and the gate electrode constituting the MOS transistor, a second insulating film be formed over the surface of the first insulating film such that the second insulating film is thicker than the first insulating film, and sidewalls be formed at the sides of the gate electrode by anisotropically etching the first insulating film and the second insulating film, thereby forming an antireflection film formed of multilayer film without need of extra procedures.

DETAILED DESCRIPTION OF THE PREFERRED EMBODIMENTS

An embodiment of the present invention will be described below.

Embodiment 1

Figure 1:
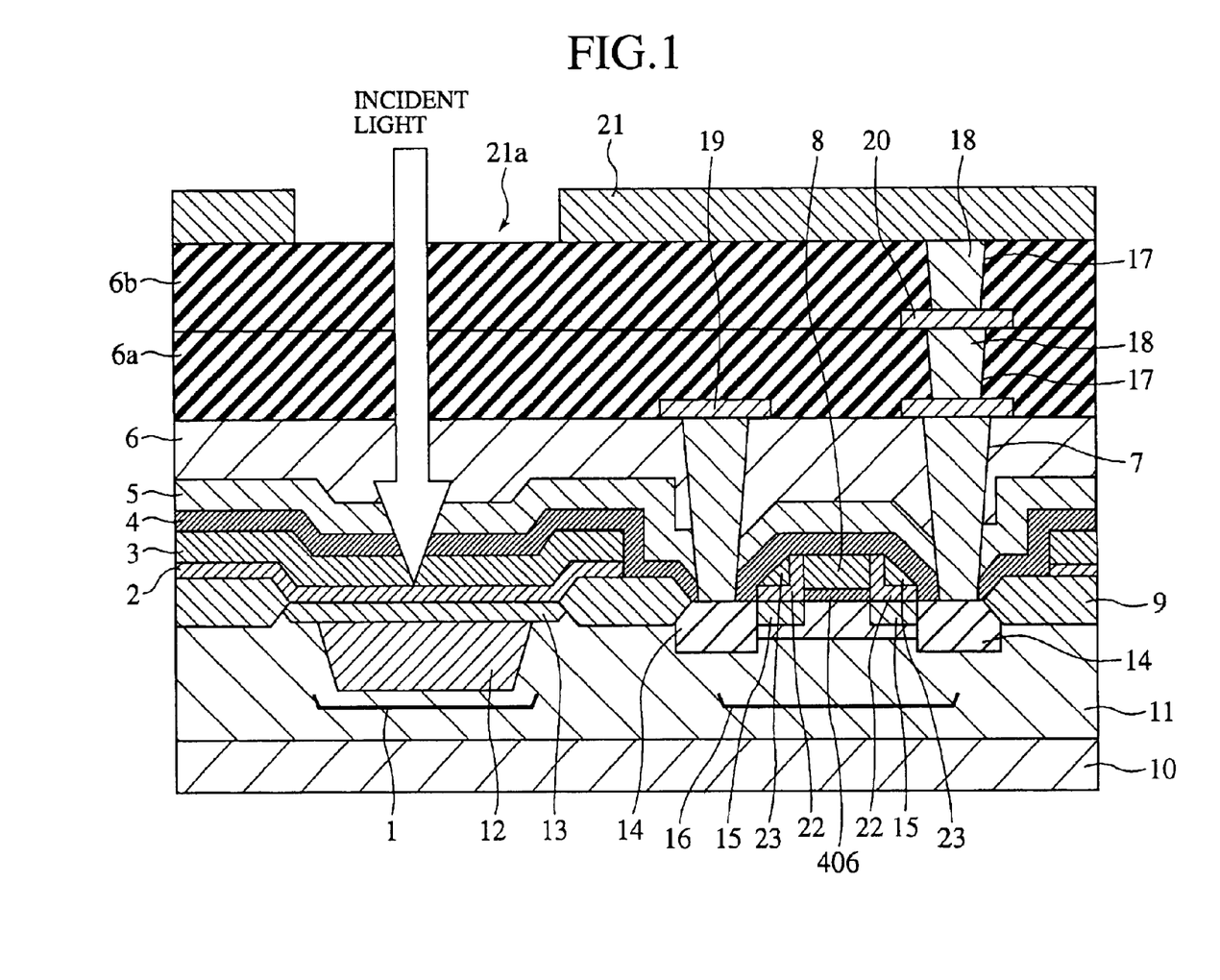
FIG. 1 is a sectional view of the CMOS image sensor produced by the producing method of a CMOS image sensor according to Embodiment 1 of the present invention.

FIG. 1 is a sectional view of the CMOS image sensor produced by the producing method of a CMOS image sensor according to Embodiment 1 of the present invention. A photodiode 1 is formed by stacking an N type diffused layer 12 and a P type diffused layer 13, and buried together with an N-type MOS transistor 16 in the top surface of a P well 11 formed over a common substrate 10. And an oxide film 2 (first type insulating film) is formed such that the oxide film covers the surface of the photodiode 1, a nitride film 3 (a second type insulating film) is formed over the oxide film 2, an oxide film 4 (a first type insulating film) is formed over the nitride film 3, and a nitride film 5 (a second type insulating film) is formed over the oxide film 4. A contact interlayer oxide film 6 (insulating layer) is formed over the nitride film 5, and contact holes 7 are provided through the contact interlayer oxide film. A first interlayer insulating layer 6a is formed over the surface of the contact interlayer oxide film 6, and a first layer aluminum film 19 is buried in the bottom surface of the first interlayer insulating layer 6a. A second interlayer insulating layer 6b is formed over the surface of the first layer insulating layer 6a, and a second layer aluminum film 20 is buried in the bottom surface of the second interlayer insulating layer 6b. Optionally, the common substrate 10 may be formed of N type or P type silicon. The antireflection film of the photodiode 1 is formed of the stacked oxide film 2, nitride film 3, oxide film 4, and nitride film 5.

The contact holes 7 are formed through the stacked oxide film 4, nitride film 5, and contact interlayer oxide film 6, and in the contact hole is inserted a tungsten plug 18 (contact plug). A gate electrode 8 is formed over the top surface of a gate oxide film 406 formed on the top surface of the P well 11, and over the gate electrode are stacked the oxide film 4, the nitride film 5, the contact interlayer oxide film 6, the first interlayer insulating layer 6a, and the second interlayer insulating layer 6b. Field oxide films 9 are silicon oxide films formed over the top surface of the P well 11, and the field oxide film is used to form each N type diffused layer or P type diffused layer arranged in predetermined positions on the top surface of the P well 11. Source/drain N type diffused layers 14 are arranged at both sides of a channel doped layer 402 (not shown) formed below the gate electrode 8 and the gate oxide film 406, and the source/drain N type diffused layers are buried within the P well 11 such that the source/drain N type diffused layers sandwich both sides of the gate electrode 8 and the gate oxide film 406 stacked on the channel doped layer. LDD diffused layers 15 are arranged between the gate oxide film 406 and each of the source/drain N type diffused layer 14, and also arranged under sidewalls 22, 23, and are buried in the P well 11, adjacent to the source/drain N type diffused layers 14. The N type MOS transistor 16 is formed by the gate electrode 8, the gate oxide film 406, the channel dope layer 402, the source/drain N type diffused layers 14, and the LDD diffused layers 15 which are arranged or buried in the top surface of the P well 11.

A through-hole 17 is formed in a predetermined position through the first interlayer insulating layer 6a and the second interlayer insulating layer 6b. A tungsten plug 18 is inserted in the through-hole 17, and connects a first layer aluminum film 19 (wiring film) with a second layer aluminum film 20 (wiring film) located above the first layer aluminum film, and further connects the second layer aluminum film 20 with a third layer aluminum film 21 (wiring film) located above the second layer aluminum film. The tungsten plugs 18 are inserted in the contact holes 7 as previously stated, and connect each of the source/drain N type diffused layer 14 with the first layer aluminum film 19 located above the source/drain N type diffused layer. The first layer aluminum film 19 is formed with wiring patterns on the top surface of the contact interlayer oxide film 6, and is buried in the first interlayer insulating layer 6a. The second layer aluminum film 20 is formed with wiring patterns on the top surface of the first interlayer insulating layer 6a, and is buried in the second interlayer insulating layer 6b. The third layer aluminum film 21 is formed over the top surface of the second interlayer insulating layer 6b. Additionally, through the third layer aluminum film 21 is formed an opening 21a for introducing incident light and transmitting the light to the photodiode 1.

The sidewalls 22 are formed of an oxide film, and provided at the sides of the gate electrode 8 in contact with the electrode. The sidewalls 23 are formed of a nitride film, and provided in contact with the external walls of the sidewalls 22. The oxide film 4 is formed over the N type MOS transistor 16, and the surfaces of the sidewalls 22, 23 provided at the sides of the gate electrode 8 constituting the N type MOS transistor 16. Over the oxide film 4 are stacked the nitride film 5 and the contact interlayer oxide film 6 as mentioned above.

The operation will now be described as below.

FIGS. 2A–7C are explanatory diagrams of the procedure of the producing method of a CMOS image sensor according to Embodiment 1. FIGS. 2A–7C show in section the steps of the CMOS image sensor (workpiece) to be produced, which are denoted with steps ST1–ST22 in the procedural order. In FIGS. 2A–7C, the same portions in section of the CMOS image sensor as the ones in FIG. 1 are designated by similar numerals, and these explanations are omitted.

Figure 2A:
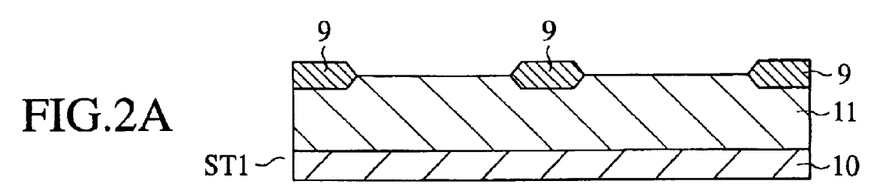
FIGS. 2A–2D are explanatory diagrams of the procedure of the producing method of a CMOS image sensor according to Embodiment 1.

In the step ST1 shown in FIG. 2A, the following procedure is performed. P type impurities are introduced into the common substrate 10 formed of silicon from the surface thereof by means of ion implantation, thermal diffusion or the like, to thereby form the P well 11 thereover. Subsequently, the predetermined region of the top surface of the P well 11 is masked by use of a silicon nitride film (not shown), and in the non-masked region is formed the field oxide film 9 for isolation.

Figure 2B:
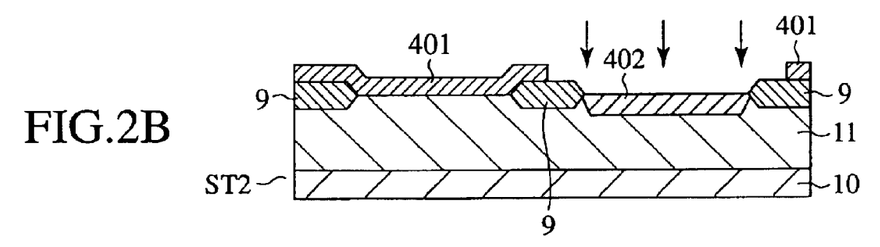

In the step ST2 shown in FIG. 2B, the silicon nitride film (not shown) masking the surface of the P well 11 is removed, and then the region in which the N type MOS transistor 16 shown in FIG. 1 is to be formed is exposed, to thereby form a mask pattern 401 masking the surface of the P well 11 and the field oxide films 9 by lithography. P type impurities such as boron, for instance, are implanted in the top surface of the P well 11 on which the mask pattern 401 is formed by means of ion implantation or the like, to thereby form a channel doped layer 402 adjusting the threshold of the N type MOS transistor 16 in the region that is not masked with the mask pattern 401, that is, in the region in which the N type MOS transistor 16 is to be formed.

Figure 2C:
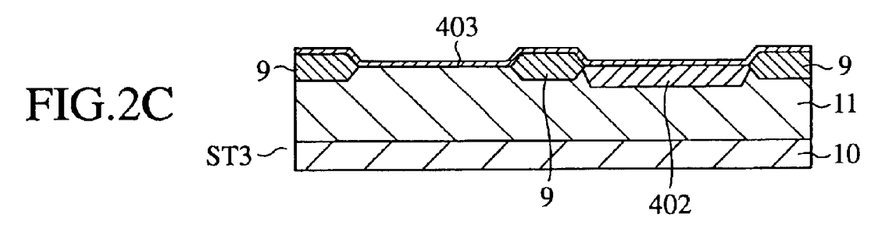

In the step ST3 shown in FIG. 2C, the silicon oxide film of the mask pattern 401 formed on the surface of the P well 11 and the like is removed by means of etching. A silicon oxide film 403 that becomes the gate oxide film 406 of the N type MOS transistor 16 is formed by means of thermal oxidation, for instance, over the surface of the P well 11 from which the unnecessary silicon oxide film is removed.

Figure 2D:
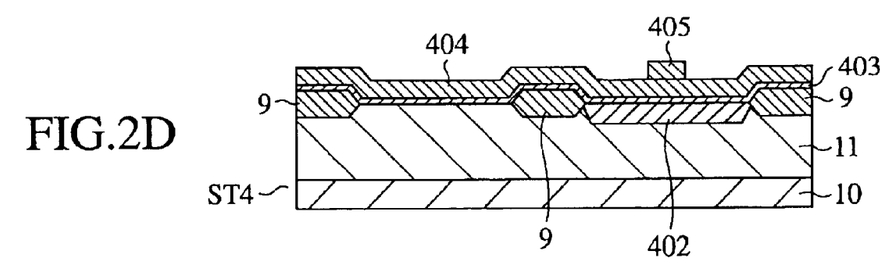

In the step ST4 shown in FIG. 2D, a polysilicon layer 404 that becomes the gate electrode 8 of the N type MOS transistor 16 is formed over the surface of the silicon oxide film 403. Then, a mask pattern 405 is formed on the surface of the polysilicon layer 404 by lithography to mask the region in which the gate electrode 8 is formed.

Figure 3A:
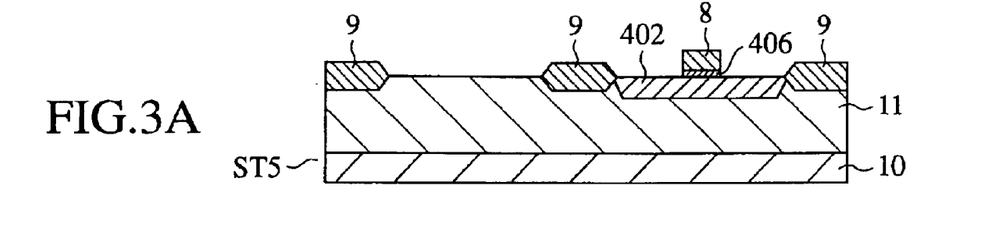
FIGS. 3A–3D are explanatory diagrams of the procedure of the producing method of a CMOS image sensor according to Embodiment 1.

In the step ST5 shown in FIG. 3A, an etching procedure is performed such that the polysilicon 404 located in the region masked with the mask pattern 405 and the silicon oxide film 403 located under the polysilicon remain, to thereby remove the unnecessary portions of the polysilicon 404 and the silicon oxide film 403. The etching procedure forms the gate electrode 8 and the gate oxide film 406 located under the gate electrode. After that, the mask pattern 405 is removed by the etching procedure.

Figure 3B:
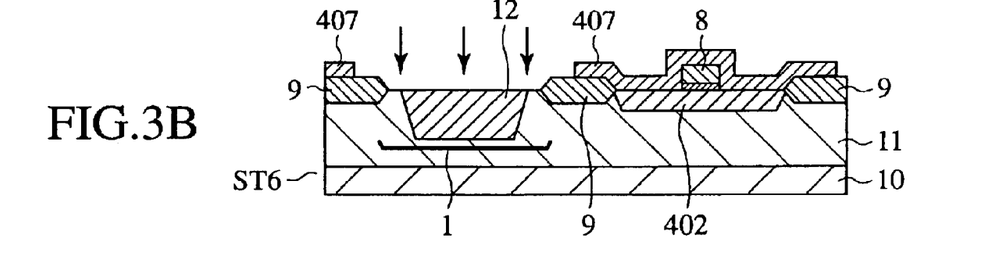

In the step ST6 shown in FIG. 3B, the mask pattern 407 is formed by lithography over the surfaces of the P well 11, the field oxide films 9, the channel doped layer 402, and the gate electrode 8, to thereby mask the surfaces and expose the region in which the photodiode 1 is to be formed. Subsequently, N type impurities such as phosphorus are ion-implanted in the surfaces of the P well 11, and so on, which are not masked with the mask pattern 407, to thereby form the N type diffused layer 12 serving as the charge storage layer of the photodiode 1.

Figure 3C:
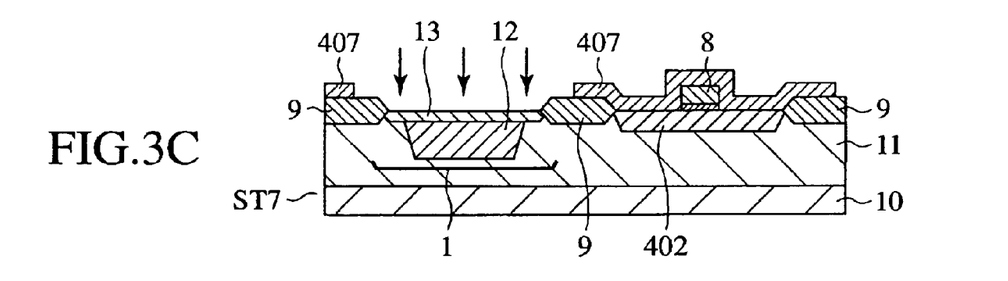

In the step ST7 shown in FIG. 3C, after the N type diffused layer 12 is formed, P type impurities such as boron, for instance, are ion-implanted in the workpiece in a state of being masked with the mask pattern 407, to thereby form the P type diffused layer 13 serving as the surface layer of the photodiode 1 over the surface of the N type diffused layer 12.

Figure 3D:
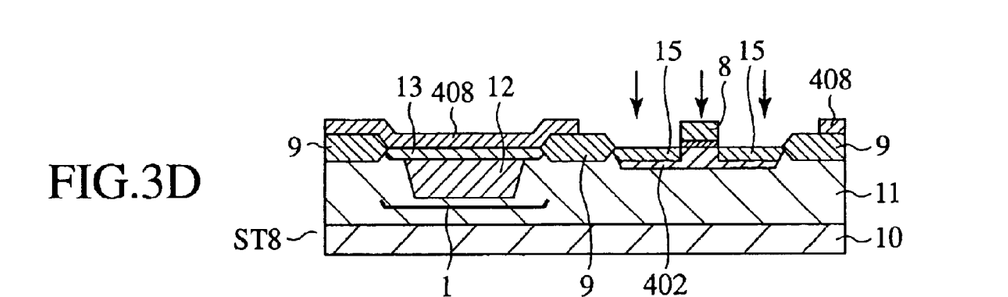

In the step ST8 shown in FIG. 3D, after removing the mask pattern 407 by the etching procedure, a low concentration diffused area is formed over the surface of the P well 11, and so on. For instance, a mask pattern 408 exposing the portion that is to be the source/drain of the N type MOS transistor 16 is formed by lithography, and then low concentration N type impurities such as phosphors are ion-implanted in the exposed region, to thereby form LDD diffused layers 15 that are low concentration N type diffused regions over the channel doped layer 402.

Figure 4A:
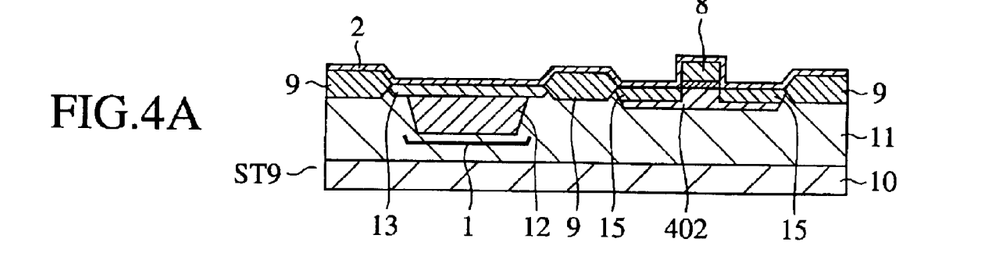
FIGS. 4A–4D are explanatory diagrams of the procedure of the producing method of a CMOS image sensor according to Embodiment 1.

In the step ST9 shown in FIG. 4A, after removing the mask pattern 408 by the etching procedure, the silicon oxide film 2 that becomes the sidewalls 22 constituting the N type MOS transistor 16 is formed. The oxide film 2 is formed on the workpiece such that the oxide film covers all the surface of the P well 11.

Figure 4B:
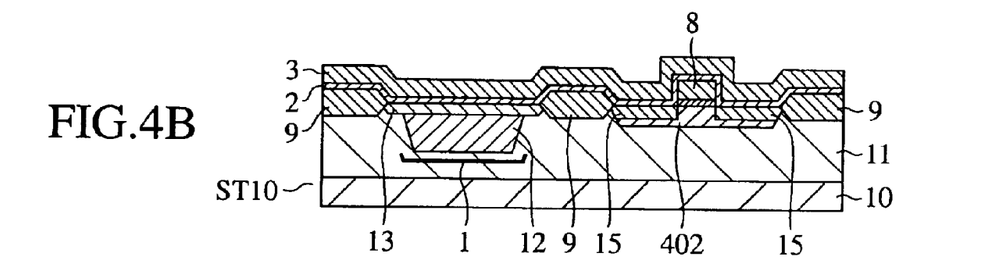

In the step ST10 shown in FIG. 4B, the nitride film 3 that becomes the sidewalls 23 constituting the N type MOS transistor 16 is formed over the oxide film 2. At that time, the nitride film 3 is formed thereover such that the nitride film is considerably thicker than the oxide film 2. The nitride film 3 is formed over the oxide film 2 such that the nitride film covers all the surface of the P well 11.

Figure 4C:
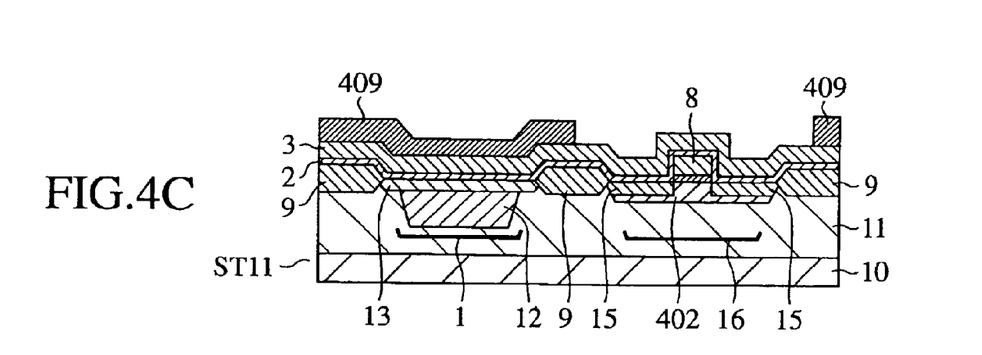

In the step ST11 shown in FIG. 4C, a mask pattern 409 exposing the region in which the N type MOS transistor 16 is to be formed and masking the surface of the nitride film 3 is formed by lithography.

Figure 4D:
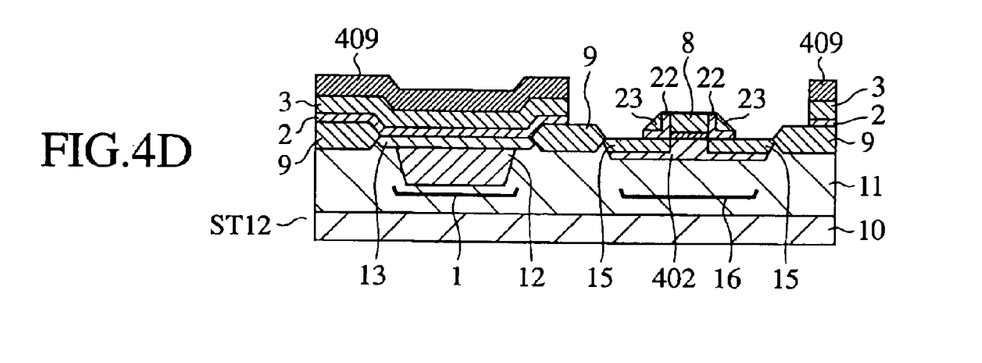

In the step ST12 shown in FIG. 4D, the portions of the nitride film 3 and the oxide film 2 that are not masked are removed by an anisotropic etching procedure, to thereby form the sidewalls 22, 23. Because the nitride film 3 is formed thereover such that the nitride film is much thicker than the oxide film 2 as mentioned above, the sidewalls 23 formed of a silicon nitride film can be precisely formed by the anisotropic etching procedure such that the sidewalls 23 formed of a silicon nitride film cover the sides of the sidewalls 22 formed of a silicon oxide film, that is, the external wall portions of the sidewalls 22. Accordingly, even if the contact holes 7 are formed misaligned toward the gate electrode 8 in the later steps, the LDD diffused layers 15 can be prevented from being contacted with the contact holes 7. In the aforementioned steps, a multilayer film formed of a plurality of combinations of a silicon oxide film and a silicon nitride film, that is, of the oxide film 2 and the nitride film 3 is formed over the surface of the photodiode 1, to thereby form the antireflection film formed of a plurality of oxide films and nitride films that are alternately deposited, film by film.

Figure 5A:
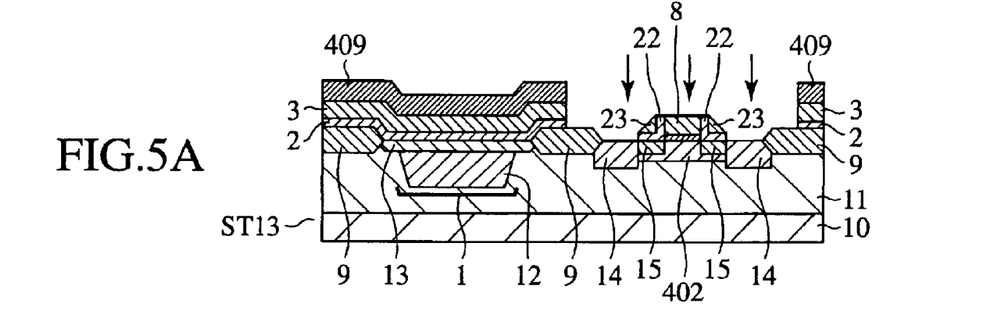
FIGS. 5A–5D are explanatory diagrams of the procedure of the producing method of a CMOS image sensor according to Embodiment 1.

In the step ST13 shown in FIG. 5A, high concentration N type impurities such as phosphorus, arsenic or the like are ion-implanted in the workpiece from above of the nitride film 3 over which the mask pattern 409 is formed, to thereby form the source/drain N type diffused layers 14 within the regions that are not masked with the mask pattern 409. At that time, the ion-implantation is performed such that the high concentration N type impurities are not diffused into the portions located directly underneath the sidewalls 22, 23, and thereby the LDD diffused layers 15 remain as the low concentration N type diffused regions.

Figure 5B:
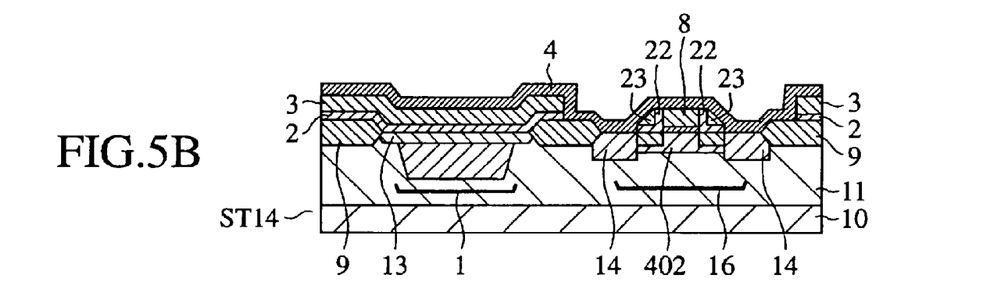

In the step ST14 shown in FIG. 5B, after removing the mask pattern 409 by the etching procedure, the silicon oxide film 4 is formed over the surfaces of the nitride film 3, the field oxide films 9, the source/drain N type diffused layers 14, the sidewalls 22, 23 and the gate electrode 8. Because the two-step etching procedure that forms the contact hole 7 connecting the source/drain N type diffused layers 14 and the first layer aluminum films 19, the through-hole 17 connecting the first layer aluminum film 19 and the second layer aluminum film 20, and the through-hole 17 connecting the second layer aluminum film 20 and the third layer aluminum film 21, is a well known technique, the detailed explanation is omitted herein.

Figure 5C:
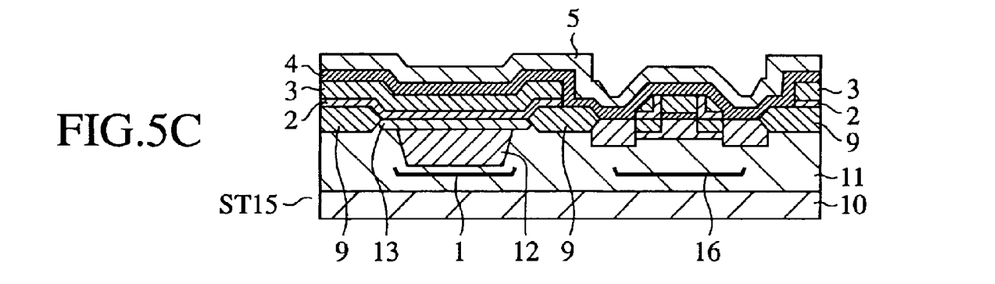
Figure 5D:
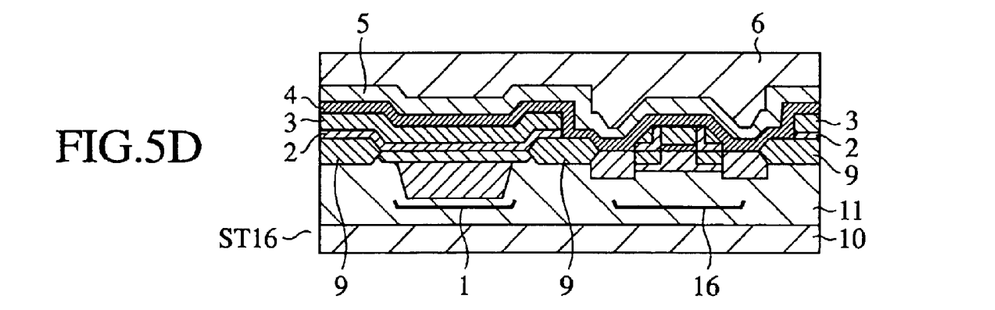

In the step ST15 shown in FIG. 5C, the silicon nitride film 5 is formed all over the surface of the oxide films 4 such that the silicon nitride film 5 is thicker than the oxide film 4. In the step ST16 shown in FIG. 5D, the contact interlayer silicon oxide film 6 is formed all over the surface of the nitride film 4.

Figure 6A:
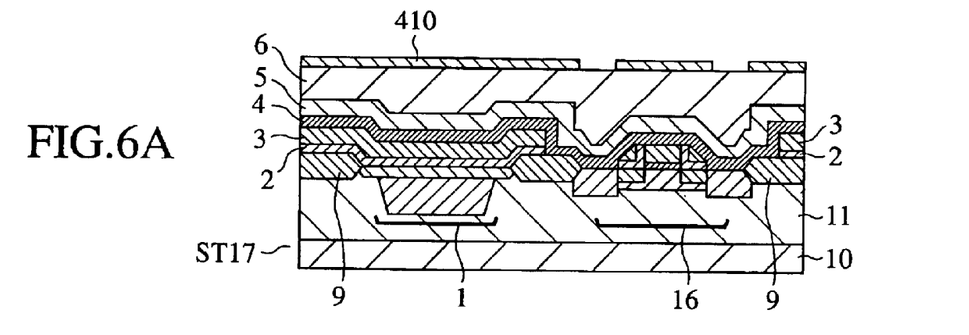
FIGS. 6A–6C are explanatory diagrams of the procedure of the producing method of a CMOS image sensor according to Embodiment 1.

In the step ST17 shown in FIG. 6A, a mask pattern 410 exposing the regions in which the contact holes 7 are to be formed is formed over the surface of the contact interlayer oxide film 6 by lithography. In the step ST18 shown in FIG. 6B, the portions of the contact interlayer oxide film 6, located in the regions that are not masked with the mask pattern 410 are subjected to a high-selective dry etching procedure, that is, a dry etching procedure that properly selectively etches the silicon oxide film by distinguishing the silicon oxide film from the silicon nitride film, to thereby form the contact holes 7 leading to the nitride film 5 through the contact interlayer oxide film 6.

Figure 6B:
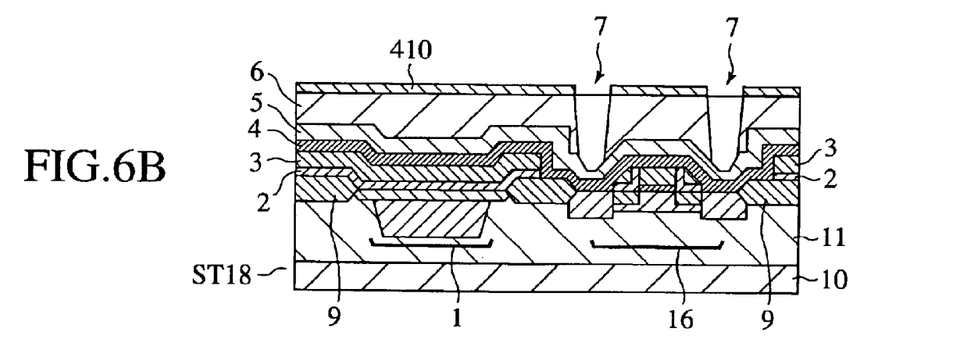
Figure 6C:
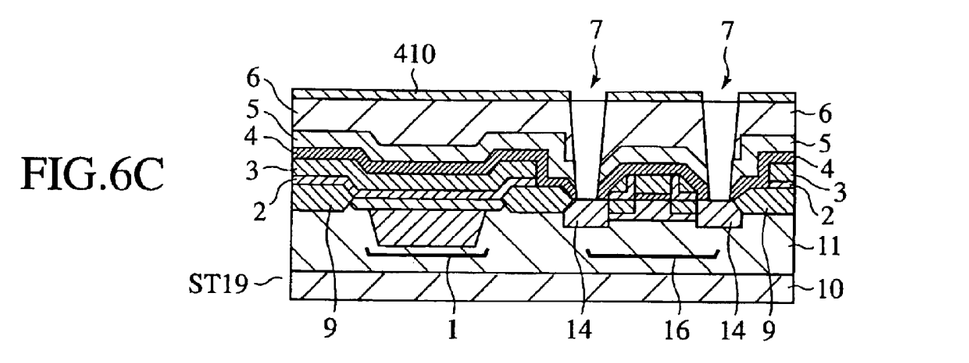

In the step ST19 shown in FIG. 6C, the regions that are not masked with the mask pattern 410, that is, the portions in which the contact holes 7 are formed in the step ST18 shown in FIG. 6B are subjected to a low-selective dry etching procedure, that is, a dry etching procedure not-selectively etches the silicon oxide film and the silicon nitride film, to thereby etch the nitride film 5 and the oxide film 4 and form the contact holes 7 such that the contact holes lead to the source/drain N type diffused layers 14. At that time, the etching procedure is carried out such that the etching reaction proceeds along the external walls of the sidewalls 23 formed at both sides of the gate electrode 8, and in order to prevent the contact holes 7 close to the gate electrode 8, over-etchings by which the contact holes lead to the portion other than the source/drain N type diffused layer 14 should be avoided.

The steps ST17 to ST19 shown in FIGS. 6A–6C represent the above-mentioned two-step etching procedure. Use of the high-selective etching procedure and the low-selective etching procedure in the right place as stated above makes it possible to prevent the gate contact and the diffusion contact having mutually different thicknesses of the contact interlayer oxide film 6 from being over-etched, thereby enabling to control the etching procedure so as to precisely form the contact holes 7. In the aforementioned steps, over the surface of the photodiode 1 have been formed a multilayer film formed by two combinations of the oxide film 2 and nitride film 3, and the oxide film 4 and nitride film 5.

Figure 7A:
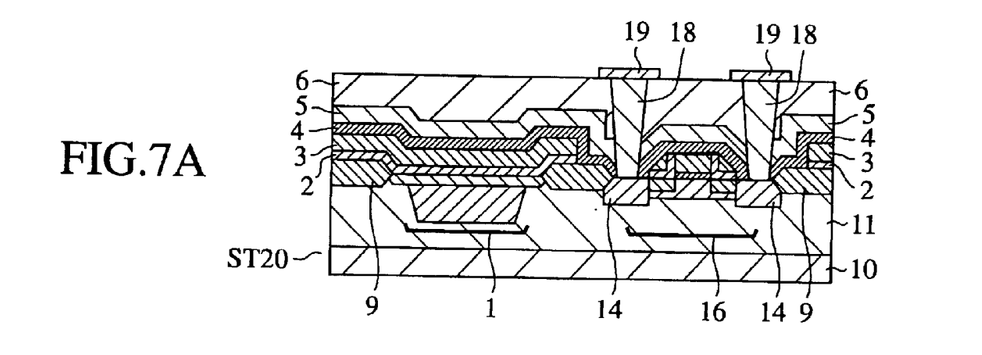
FIGS. 7A–7C are explanatory diagrams of the procedure of the producing method of a CMOS image sensor according to Embodiment 1.

In the step ST20 shown in FIG. 7A, after the mask pattern 410 is removed by the etching procedure, the tungsten plug 18 is inserted in the contact hole 7, and the first layer aluminum film 19 is formed over the top surface of the contact interlayer oxide film 6 as being in contact with the top ends of the tungsten plugs 18. Then, the wiring pattern is formed from the first layer aluminum film, based on the mask pattern (not shown) by lithography.

Figure 7B:
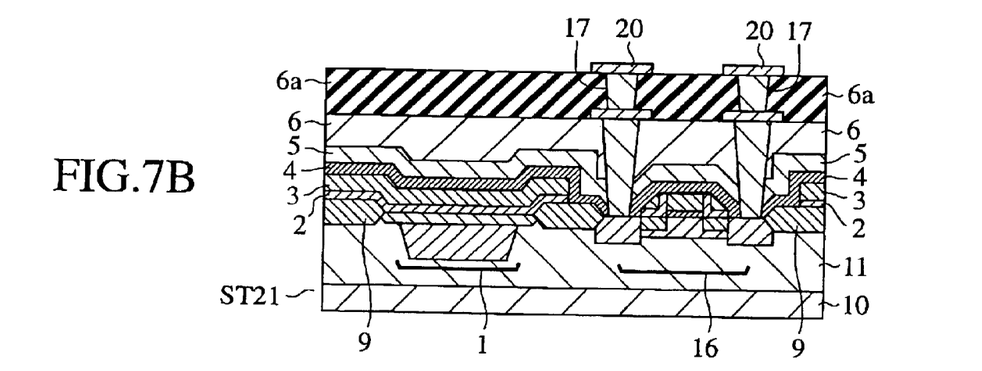

In the step ST21 shown in FIG. 7B, the first interlayer insulating layer 6a is formed over the surface of the contact interlayer oxide film 6 on which the first layer aluminum films 19 are provided, and the through-holes 17 are formed at the predetermined positions based on the mask pattern (not shown) by lithography and etching. The tungsten plug 18 is inserted in the formed through-hole 17. Over the surface of the first interlayer insulating layer 6a is formed the second layer aluminum film 20, and the second layer aluminum film 20 is formed into the wiring pattern based on the mask pattern (not shown) by lithography and etching procedure. After that, the predetermined portions of the first layer aluminum films 19 and the second layer aluminum films 20 are connected with the tungsten plugs 18 inserted in the through-holes 17.

Figure 7C:
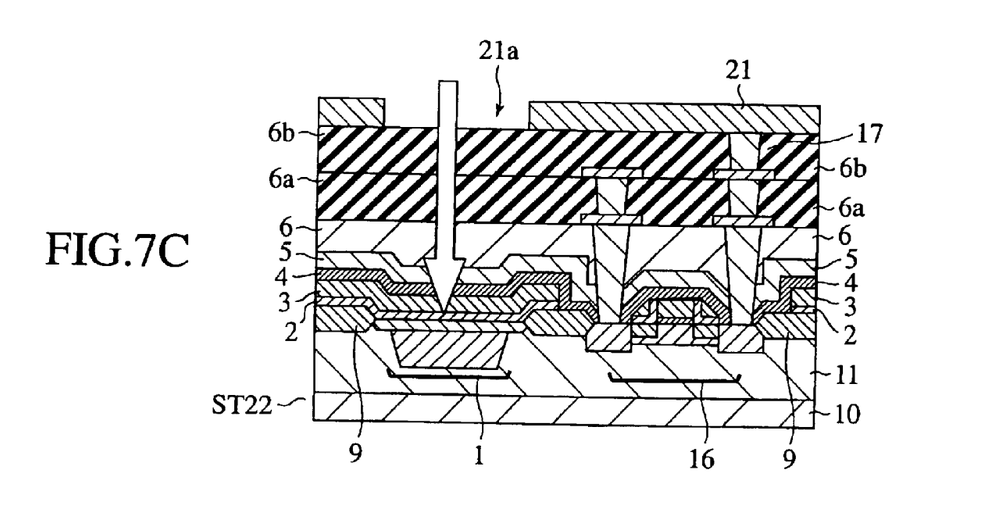

In the step ST22 shown in FIG. 7C, the second interlayer insulating layer 6b is formed over the surface of the first interlayer insulating layer 6a on which the second layer aluminum films 20 are provided, to thereby form the through-hole 17 therein at the predetermined position based on the mask pattern (not shown) by lithography and etching procedure. The tungsten plug 18 is inserted in the formed through-hole 17. Over the surface of the second interlayer insulating layer 6b is formed the third layer aluminum film 21, and the third layer aluminum film 21 is formed into the pattern based on the mask pattern (not shown) by lithography and etching, the predetermined portions of the second layer aluminum film 20 and the third layer aluminum film 21 being connected with the tungsten plug 18 inserted in the through-hole 17. The opening 21a is provided at the predetermined portion within the third layer aluminum film 21 such that the photodiode 1 receives the incident light through the opening. The third layer aluminum film is formed (patterned) such that the film covers the other portions to block the light, and is used as the power supply and the ground line, and so on.

Figure 8A:
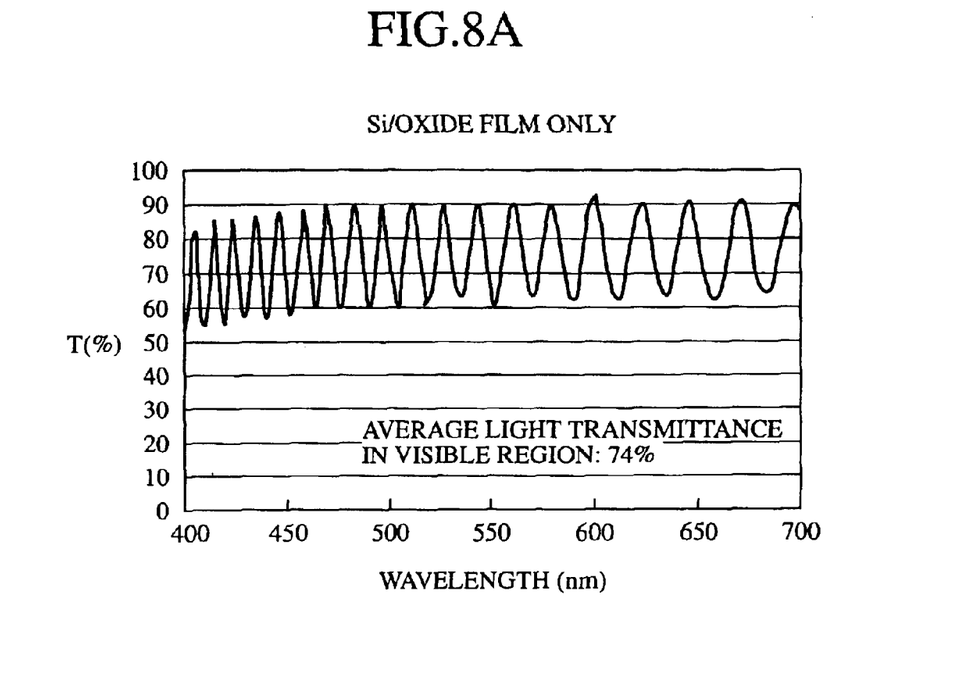
FIG. 8A is an explanatory diagram of the light transmittance of an oxide film.
Figure 8B:
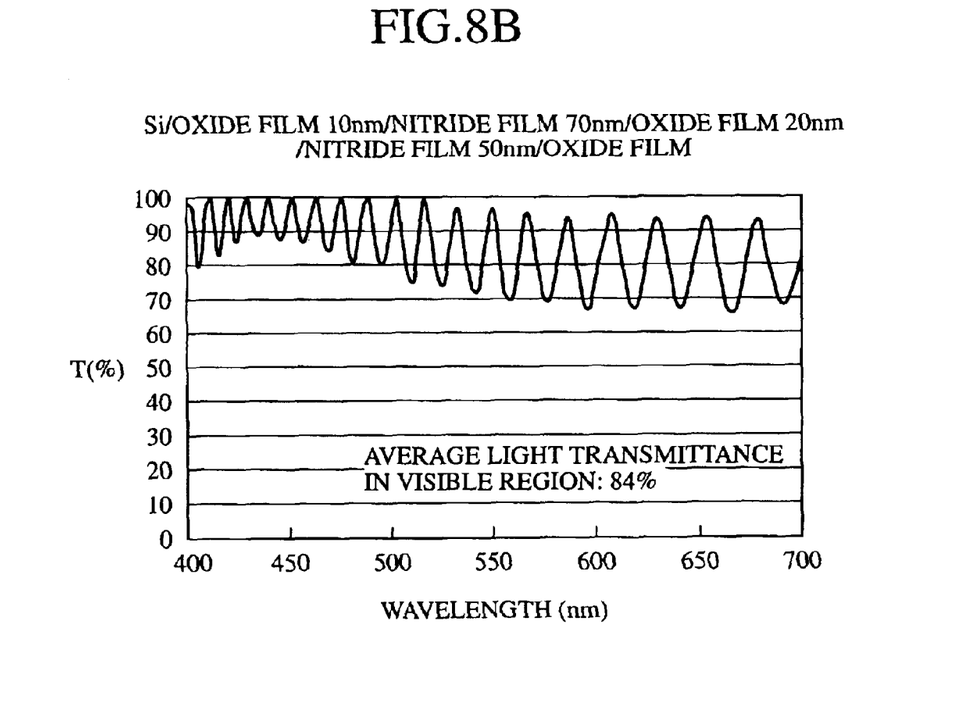
FIG. 8B is an explanatory diagram of the light transmittance of stacked oxide films and nitride films.

FIG. 8A is an explanatory diagram of the light transmittance of an oxide film, and FIG. 8B is an explanatory diagram of the light transmittance of stacked oxide films and nitride films. FIG. 8A is a graph where the relationship between the wavelength (nm) and the transmittance T (%) of the incident light is shown for an antireflection film formed of oxide films only, which is formed over the photodiode 1. FIG. 8B is a graph where the relationship between the wavelength (nm) and the transmittance T (%) of the incident light is shown for an antireflection film stacked over the photodiode 1, which is a multilayer film formed of an oxide film (10 nm), a nitride film (70 nm), an oxide film (20 nm), a nitride film (50 nm), and an oxide film. As is apparent from FIGS. 8A and 8B, as compared with the antireflection film formed of only oxide film with the light transmittance shown in FIG. 8A, the antireflection film formed of the multilayer film with the light transmittance shown in FIG. 8B has high transmittance of light with wavelengths of 400–650 nm (in the visible region). Thus, the construction of the antireflection film by use of a multilayer film brings an increased visible light transmittance T, and moreover makes it possible to reduce the transmittance of near-infrared rays, enhance the light receptive sensitivity of a CMOS image sensor, and reduce the transmittance of near-infrared rays thereof.

Though the CMOS image sensor described above is the photodiode 1 including an antireflection film that is a multilayer film formed of a plurality of oxide films and nitride films, a CMOS image sensor having a photodiode that includes an antireflection film that is a multilayer film formed of a combination of one oxide film and one nitride film or in which the number of oxide film is not equal to the number of nitride film, and an N type MOS transistor having sidewalls, can be similarly produced by controlling the etching procedure.

As mentioned above, according to Embodiment 1, since the sidewalls 22, 23 are formed by anisotropic etching, and the contact hole 7 is formed by two-step etching, the antireflection film that is the multilayer film formed of the oxide film 2, nitride film 3, oxide film 4, and nitride film 5 can be form over the surface of the photodiode 1 without an addition of extra procedure.

Moreover, because the antireflection film is formed of the multilayer film formed of oxide film 2, nitride film 3, oxide film 4, and nitride film 5, the near-infrared rays incident on photodiode 1 can be reduced.

What is claimed is:

1. A producing method of a CMOS image sensor, comprising the steps of:
    forming a photodiode and a MOS transistor within a well formed over a common substrate;
    forming an antireflection film over the photodiode; and
    forming an insulating layer over the antireflection film and the MOS transistor, wherein the step of forming the antireflection film includes the steps of:
        forming a first type insulating film over a surface of the photodiode and a surface of a gate electrode of the MOS transistor;
        forming a second type insulating film over a surface of the first type insulating film such that the second type insulating film is thicker than the first type insulating film; and
        forming sidewalls at sides of the gate electrode by anisotropically etching the stacked first type insulating film and second type insulating film.

2. The producing method of a CMOS image sensor according to claim 1, comprising the steps of:
    anisotropically etching the first type insulating film and the second type insulating film, to thereby form a sidewall at the side of the gate electrode, and then forming an insulating layer;
    high-selectively dry-etching the insulating layer; and
    low-selectively dry-etching the insulating layer, wherein the producing method of a CMOS image sensor forms a contact hole passing through the insulating layer, located along the external wall of the sidewall.

3. The producing method of a CMOS image sensor according to claim 1, wherein the step of forming the antireflection film two or more times carries out the steps of:
    forming an oxide film serving as the first type insulating film over the surface of the photodiode and a surface of the gate electrode of the MOS transistor; and
    forming a nitride film serving as the second type insulating film over a surface of the oxide film, to thereby form the antireflection film formed of a plurality of oxide films and nitride films that are alternately deposited, film by film, over the photodiode and the MOS transistor.

4. The producing method of a CMOS image sensor according to claim 3, wherein the step of forming the antireflection film comprises the steps of:
    forming sidewalls at the sides of the gate electrode constituting the MOS transistor by anisotropically etching the stacked oxide films and nitride films, and then forming an oxide film over the surfaces of the MOS transistor having the sidewalls and the nitride film; and
    forming a nitride film over the oxide film.

* * * * *